(12) United States Patent
Bennett

(10) Patent No.: US 9,446,580 B2
(45) Date of Patent: Sep. 20, 2016

(54) BALANCED STENCIL FOIL TENSIONING FRAME WITH FOIL ALIGNMENT FIXTURE

(71) Applicant: Ricky Paul Bennett, Flemington, NJ (US)

(72) Inventor: Ricky Paul Bennett, Flemington, NJ (US)

( * ) Notice: Subject to any disclaimer, the term of this patent is extended or adjusted under 35 U.S.C. 154(b) by 0 days.

(21) Appl. No.: 14/226,761

(22) Filed: Mar. 26, 2014

(65) Prior Publication Data

US 2014/0290509 A1    Oct. 2, 2014

Related U.S. Application Data

(60) Provisional application No. 61/805,490, filed on Mar. 26, 2013.

(51) Int. Cl.
| | |
|---|---|
| *B41F 15/36* | (2006.01) |
| *B41L 13/02* | (2006.01) |
| *B41F 15/34* | (2006.01) |

(52) U.S. Cl.
CPC .............. *B41F 15/36* (2013.01); *B41F 15/34* (2013.01); *B41L 13/02* (2013.01)

(58) Field of Classification Search
CPC ....................................................... B41F 15/36
See application file for complete search history.

(56) References Cited

U.S. PATENT DOCUMENTS

| | | | | | |
|---|---|---|---|---|---|
| 2,894,455 | A | * | 7/1959 | Lambert | 101/415.1 |
| 3,422,554 | A | * | 1/1969 | Prinzhorn | 38/102.1 |
| 3,908,293 | A | * | 9/1975 | Newman | 38/102.91 |
| 4,721,488 | A | * | 1/1988 | Dougherty et al. | 445/30 |
| 5,136,797 | A | * | 8/1992 | Hildebrandt | 38/102.91 |
| 5,606,912 | A | * | 3/1997 | Cane | 101/127.1 |
| 5,809,624 | A | * | 9/1998 | Nakamae et al. | 26/88 |
| 5,819,651 | A | * | 10/1998 | Zepic et al. | 101/127.1 |
| 5,983,790 | A | * | 11/1999 | Switzer et al. | 101/127.1 |
| 6,067,903 | A | * | 5/2000 | Williams | 101/127.1 |

* cited by examiner

*Primary Examiner* — Jill Culler
(74) *Attorney, Agent, or Firm* — Lyman Smith; Patent Service Associates

(57) ABSTRACT

A balanced stencil foil tensioning frame with a foil alignment fixture removes the need for the complex air/bladder arrangement of conventional systems by pivoting side members to engage foil. With less components, the tensioning frame system is reliable and light weight with few moving parts. In one embodiment, a base member can receive a stencil foil and a frame top can lock into the base member, depressing the edges of the stencil foil. The amount of provided depression can adjust the tension of the foil. In another embodiment, a plurality of tension segments can move in a linear direction to create a uniform foil tension. The alignment fixture can be wall mounted to hold foil in a vertical position. This allows for consistent alignment and attachment of foil to the tensioning frame.

19 Claims, 16 Drawing Sheets

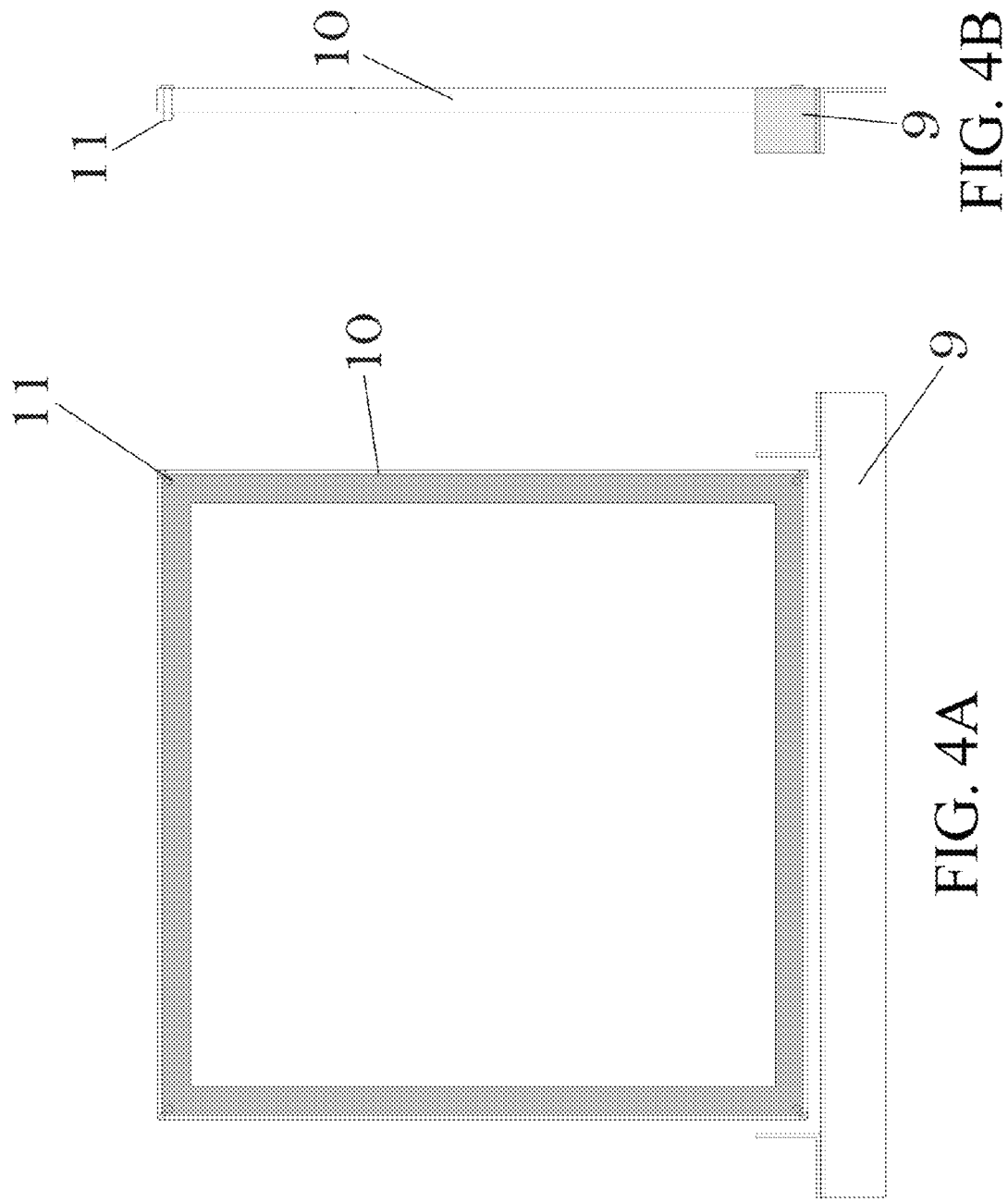

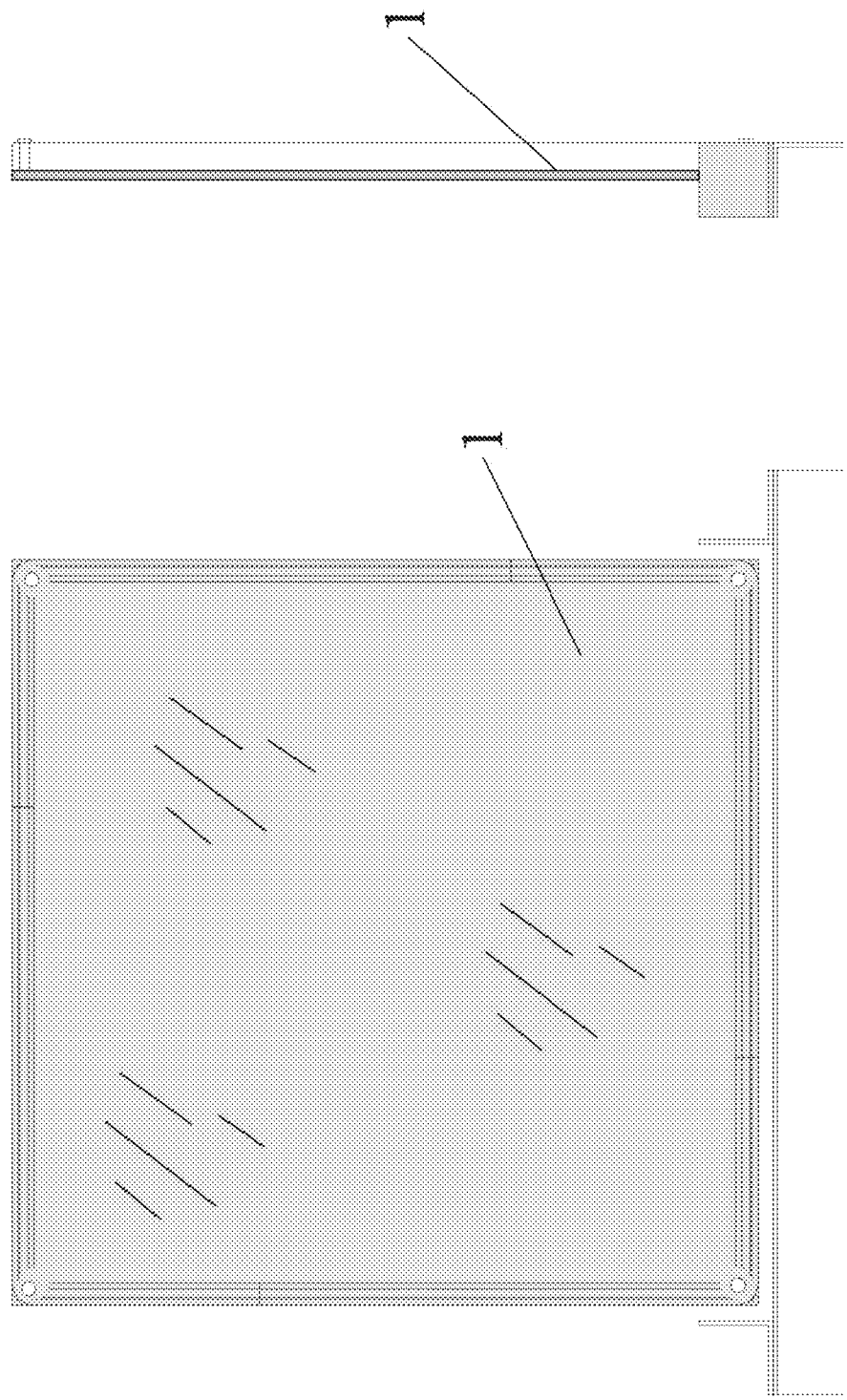

BALANCED STENCIL FOIL TENSIONING FRAME WITH FOIL ALIGNMENT FIXTURE

CROSS-REFERENCE TO RELATED APPLICATIONS

This application claims the benefit of priority of U.S. provisional patent application No. 61/805,490, filed Mar. 26, 2013, the contents of which are herein incorporated by reference.

BACKGROUND OF THE INVENTION

The present invention relates to stencil tensioning frames and, more particularly, to a balanced stencil foil tensioning frame having a foil alignment fixture.

Current manufacturing techniques for making printed circuit boards call for the mounting of components to the circuit board by surface mounting. Rather than passing the leads of a component through holes in a circuit board and then soldering the leads at the holes, the circuit board is provided with pads of solder paste and the components are placed on the pads for soldering directly to the surface of the board.

In order to place the pads of paste in appropriate locations on the circuit board, just before affixing the components to the board, a stencil-like screen is juxtaposed with the circuit board and to provide a pattern of openings registered with the locations where the pads are to be placed. The paste then is spread over the screen with a squeegee to lay down the pattern of pads. The stencil screen is typically in the form of a thin foil which is supported by a stretcher frame in an appropriately tensioned state. The frame fits into a machine which registers the tensioned screen with the circuit board and then applies the paste. Typically, the machine also stretches the stencil to achieve the desired tension of the stencil to ensure accuracy during printing.

Conventional stencil tensioning frames typically use bladders and air to either tension or release a stencil foil therefrom. These systems are usually unreliable and heavy as, for example, the bladder used typically leaks or fails completely, requiring in-depth repairs on a frequent basis. Air pressure variation can cause mis-alignment of foils and therefore cumbersome operation. Moreover, these conventional systems use a complex arrangement of springs and pneumatics, resulting in even greater possibility of failure. These conventional stencil tensioning frames often require large, flat horizontal surfaces to aid in aligning the foils.

Other conventional systems use mesh mounted foils. In these systems, tension is provided by a stretched mesh and the foil is glued to this mesh.

As can be seen, there is a need for an improved stencil foil tensioning frame.

SUMMARY OF THE INVENTION

Aspects of the present invention include a frame that can provide tension to a foil of any material, such as metal (such as nickel, stainless steel or the like), polymers, plastic paper or the like. Unlike conventional systems that apply tension to the foil by stretching the foil outwards, the frame of the present invention grips/locates the edge of the foil to stop it from moving laterally and then depresses the foil, resulting in a tensioning of the foil. The systems of the present invention have few moving parts, have low manufacturing costs, can easily adjust tension, are light weight, can be used in a chemical washing system and can work with a variety of foils.

In one aspect of the present invention, a balanced stencil foil tensioning frame comprises tensioning frame members forming a foil frame, wherein at least two of the tensioning frame members are pivoting members rotating about an axis generally parallel with at least two edges of a foil disposed in the foil frame, the pivoting members pivoting between a foil untensioned state and a foil tensioned state; linear tension segments disposed along a foil facing side of the foil frame, the linear tension segments having a protrusion extending therefrom that engages with a recess disposed about an outer perimeter of the foil, wherein the pivoting members are rotated to the foil tensioned state to cause the protrusion to apply tension to the foil.

In another aspect of the present invention, a balanced stencil foil tensioning frame comprises a base member formed generally in an L-shape with an angled upper end; a frame top fitting into the L-shape of the base frame member and engaging with the angled upper end; a protrusion on an inner bottom portion the frame top fitting into a foil/sub-frame profile of a foil retained by the frame; a displacement protrusion disposed along an outer bottom portion of the frame top, the displacement protrusion pressing against the foil when the frame top is engaged with the base member; and a latching device holding the frame top to the base member.

These and other features, aspects and advantages of the present invention will become better understood with reference to the following drawings, description and claims.

BRIEF DESCRIPTION OF THE DRAWINGS

FIG. 4A shows a top view of the alignment tools for aligning the foil and tensioning frame;

FIG. 4B shows a side view of the alignment tool of FIG. 4A;

FIG. 4C shows a top view of the foil held in place on the alignment tools of FIG. 4A;

FIG. 4D shows a side view of the foil held in place on the alignment tools of FIG. 4A;

DETAILED DESCRIPTION OF THE INVENTION

The following detailed description is of the best currently contemplated modes of carrying out exemplary embodiments of the invention. The description is not to be taken in a limiting sense, but is made merely for the purpose of illustrating the general principles of the invention, since the scope of the invention is best defined by the appended claims.

Broadly, an embodiment of the present invention provides a balanced stencil foil tensioning frame with a foil alignment fixture that removes the need for the complex air/bladder arrangement of conventional systems by pivoting side members to engage foil. With less components, the system of the present invention is more reliable and lighter in weight than these conventional systems. A plurality of tension segments can move in a linear direction to create a uniform foil tension. The alignment fixture can be wall mounted to hold foil in a vertical position. This allows for consistent alignment and attachment of foil to the tensioning frame.

Figure 1A:
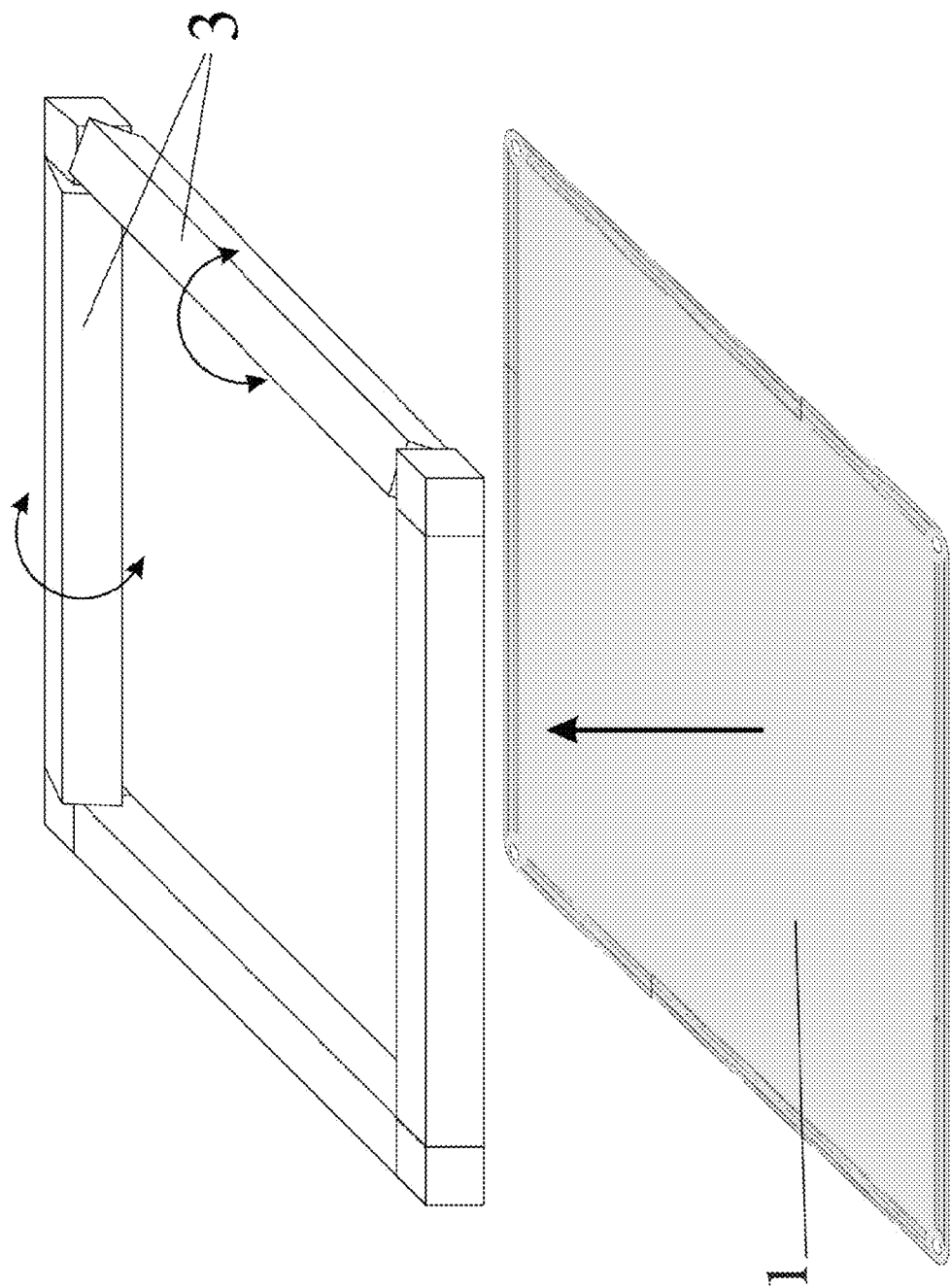
FIG. 1A shows a perspective view of a stencil foil being applied to a tensioning frame according to an exemplary embodiment of the present invention.
Figure 1B:
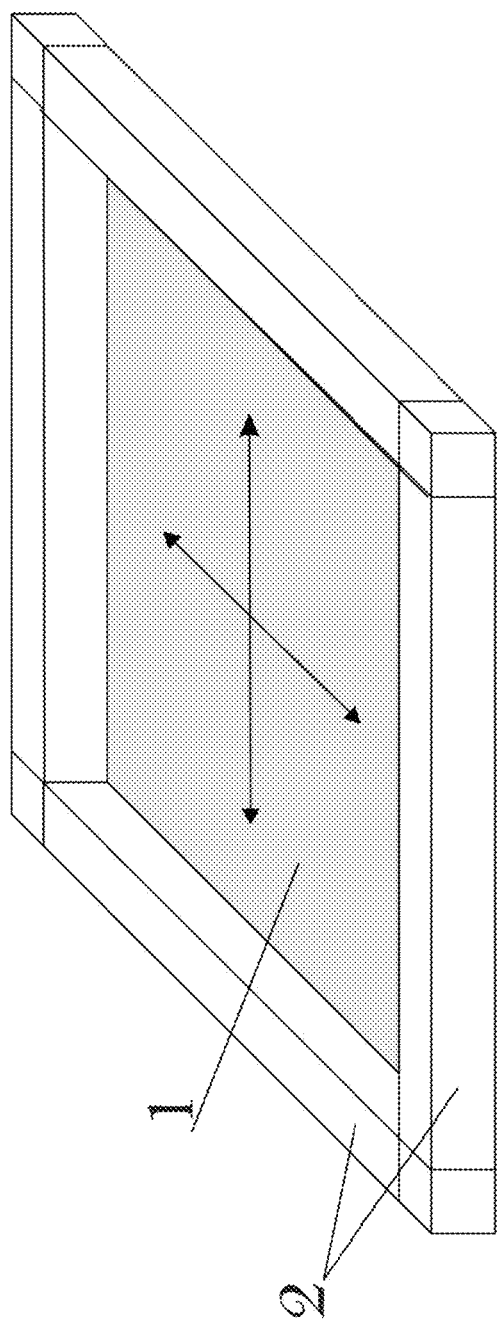
FIG. 1B shows a perspective view and a cross-sectional view of the stencil foil applied to the tensioning frame in a tensioned state.
Figure 1C:
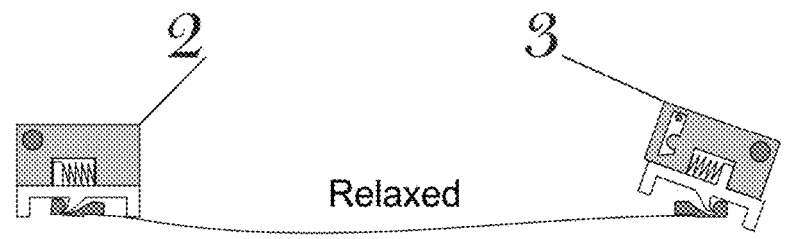
FIG. 1C shows a cross-sectional view of the stencil foil of FIG. 1B in a relaxed state.
Figure 1D:
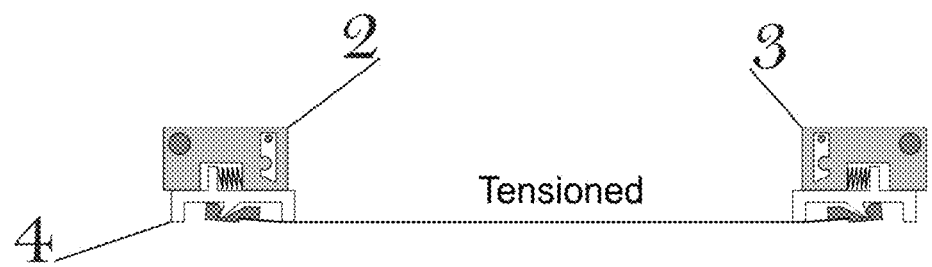
FIG. 1D shows a cross-sectional view of the stencil foil of FIG. 1B in a tensioned state.

Referring now to the Figures, FIGS. 1A and 1B show a foil 1 presented to a tensioning fame 2 with pivoting members 3 to allow for foil to be located thereunder with no tension. With the foil in position, as shown in FIGS. 1C and 1D, the pivoting members 3 can rotate causing a protrusion 9 to catch on a recess 9a disposed about a perimeter of the foil 1, engaging linear tension segments 4 to tension in opposite directions on all four sides.

Figure 2A:
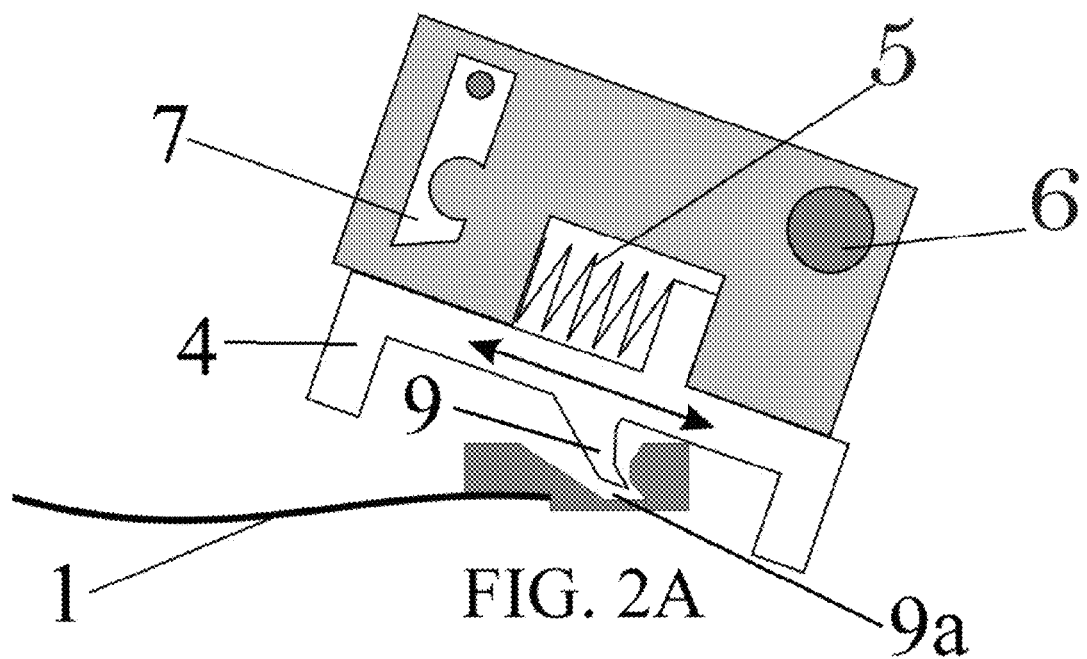
FIG. 2A is a detailed cross-sectional view of a pivoting tensioning member in an un-tensioned state.
Figure 2B:
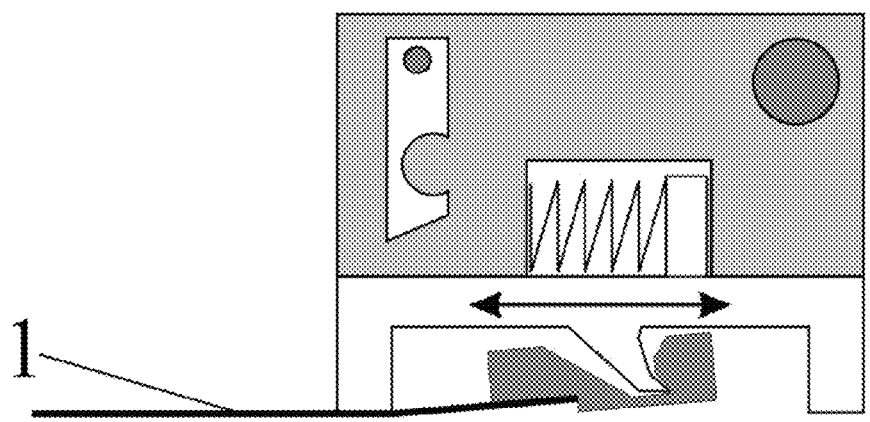
FIG. 2B is a detailed cross-sectional view of a pivoting tensioning member in a tensioned state.

FIGS. 2A and 2B show the pivoting member 3 from FIGS. 1A through 1D, engaged onto the foil 1, in an untensioned state (FIG. 2A), pivoting about an axis 6 to provide the foil 1 in a tensioned state (FIG. 2B). The linear tension segments 4 can have a U-shape, where one arm of the U-shape presses upon the foil 1 when the pivoting members 3 are in a foil tensioned state as shown in FIG. 2B. A latch 7 can be engaged and the latch 7 can be a single operated latch, or a push to latch—push to unlatch, for example. The latch 7 can maintain the pivoting member 3 in a plane so that all tensioning segments are equally gripping and pulling in opposite directions. A spring 5 can be used to provide appropriate resilient tension on the foil 1 in the tensioned state. The spring 5 can apply tension on the linear tension segments 4 to help keep the foil 1 in a uniform, properly tensioned state.

Figure 3A:
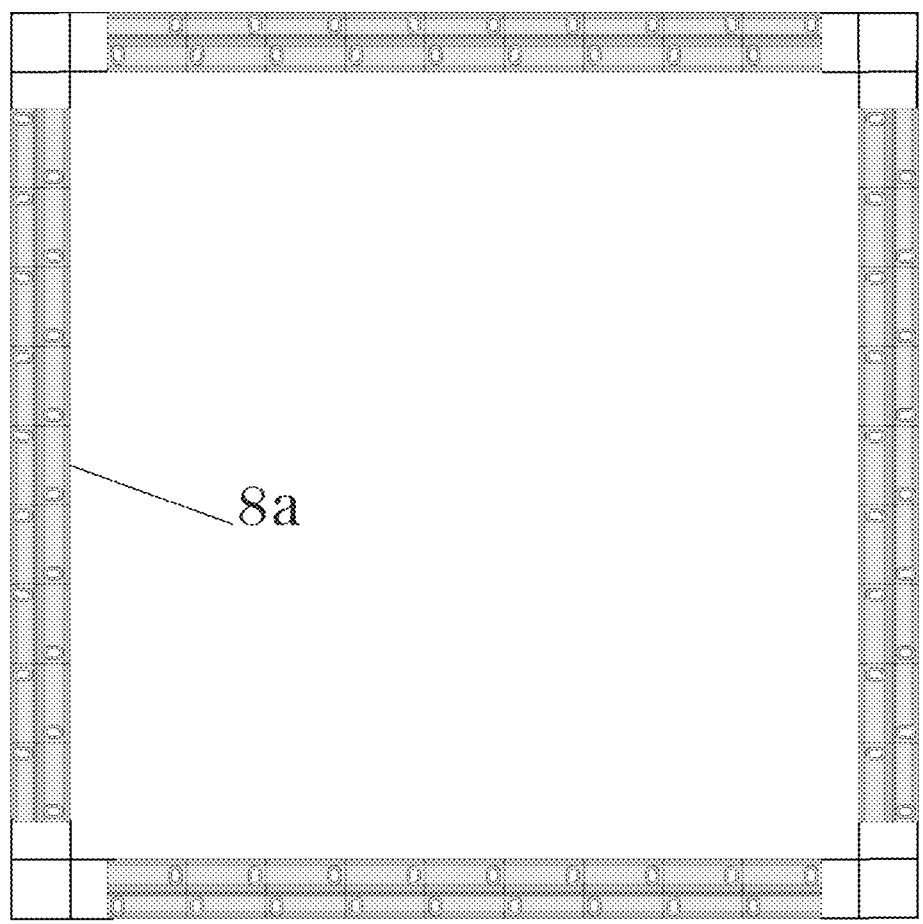
FIG. 3A is a view a tensioning section disposed about the perimeter of the tensioning frame, according to an exemplary embodiment of the present invention.
Figure 3B:
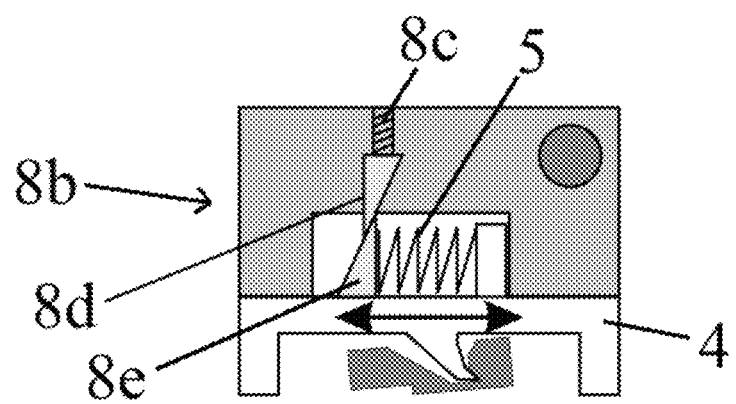
FIG. 3B is a cross-sectional view illustrating the adjustable tensioning section of FIG. 3A in an untensioned state.
Figure 3C:
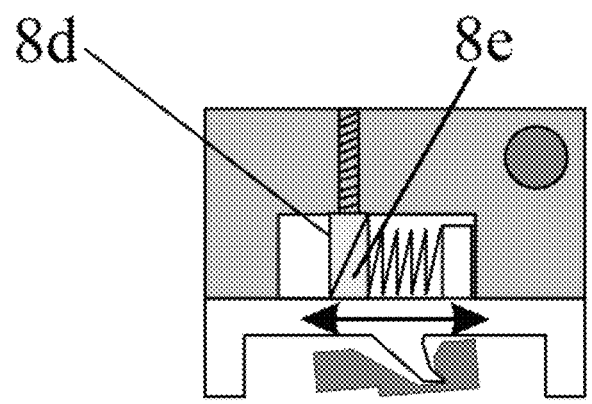
FIG. 3C is a cross-sectional view illustrating the adjustable tensioning section of FIG. 3A in a tensioned state.

FIGS. 3A through 3C show a plurality of tensioning sections 8a that are disposed around the frame to create an outward tension on the attached foil 1. In some embodiments, a plurality of adjustable tensioning sections 8b can be disposed around the frame to create an outward tension on the attached foil with the capability of finely tuning the force around the frame to create a balanced force on the foil. The adjustable tensioning sections 8b can include a set screw 8c that can be used to move an adjustment wedge 8d against a spring wedge 8e to adjust the tension affected by the spring 5.

Figure 4E:
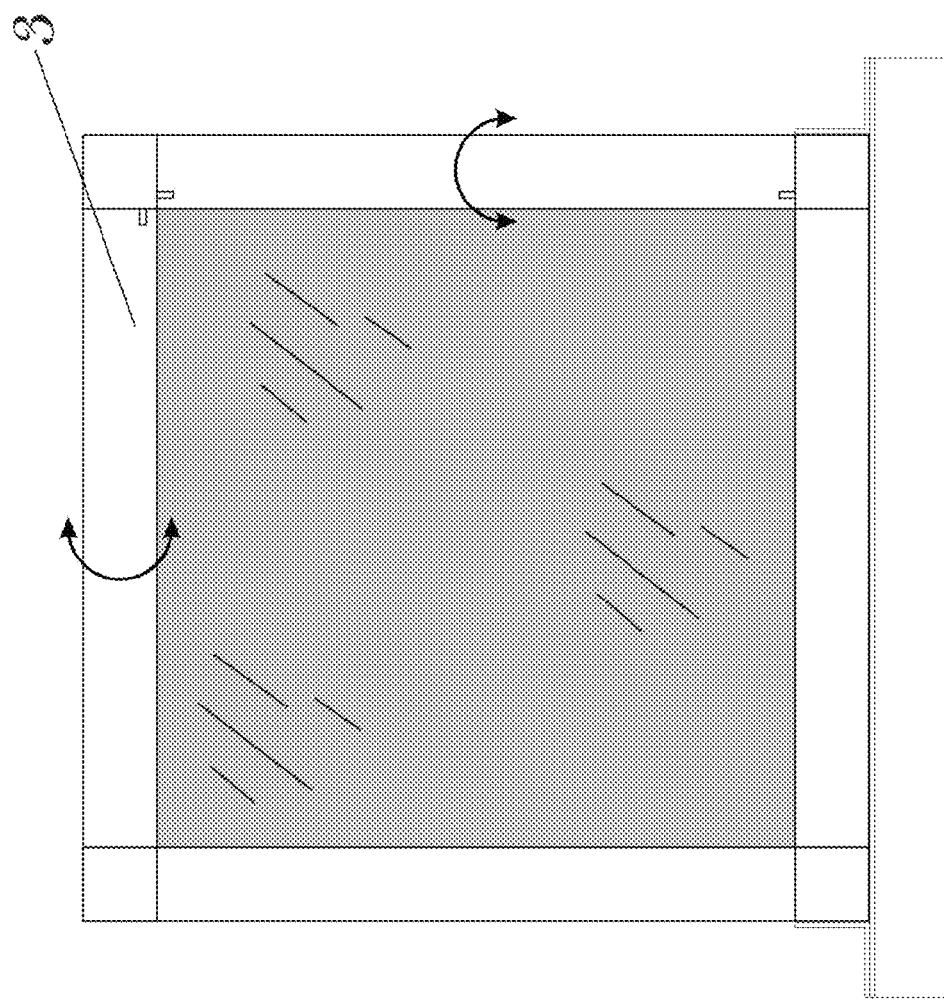
FIG. 4E shows a top view of the tensioning frame applied to the foil held in place on the alignment tools of FIG. 4C.
Figure 4F:
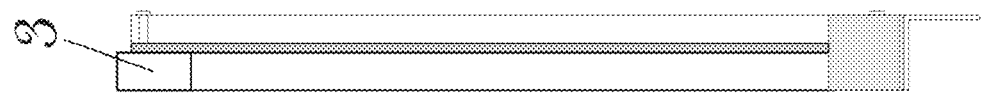
FIG. 4F shows a side view of the tensioning frame applied to the foil held in place on the alignment tools of FIG. 4C.

Referring to FIGS. 4A through 4F, an alignment foil alignment fixture can aid in reliable location of the foil 1 onto the tensioning frame. The alignment fixture 9, 10 can be used to align the foil 1 and tensioning frame by locating the foil via locating members 11, such as pins, latches, magnets, vacuum cups, or the like. The foil 1 can be held in place, as shown in FIG. 4C, awaiting the tensioning frame to be positioned, aligned and located. FIG. 4C shows the tensioning frame being positioned and located so that the pivoting members 3 can be rotated to engage tensioning segments into the foil 1. The tensioning frame can then be removed from the fixture, complete with the attached and tensioned foil. Releasing the foil from the frame can be achieved by reversing the above steps. The locating members 11 hold the foil in position while the tensioning frame release the foil, leaving the foil on the alignment fixture. The perimeter of the alignment fixture ensures that uniform pressure is applied to all sides of the foil simultaneously making for reliable engagement.

The rotating/pivoting members 3 create a dimensional shift relative to the foil which either engages the tensioning segments or releasing them. Each tensioning segment has a series of compression springs, which span across each length of the members to allow for customized tension to ensure that all points of the foil are balanced. This is achieved by different spring rates in each segment.

In some embodiments, the system of the present invention can use two fixed sides adjacent to each other with two pivoting members, as shown in FIGS. 1A and 1B, to allow the foil to be engaged. In other embodiments, all four sides could also pivot. With two fixed members, additional strength and stability can be added to the system.

Referring now to FIGS. 5 through 8, in an alternative embodiment to the spring tensioned design, a displacement tensioning system can be used. In the displacement tensioning system, the frame can be held in position and pressed down into the foil to create not only a uniform reference point, but also a tension within the perimeter of the frame. This design uses a two-piece construction which sandwiches the foil/sub-frame, clamping it in position laterally while the protrusion pushes down into the foil/stencil. Being a two-part system, the displacement tensioning system, as described below, could be integrated in to a stencil printer and only the foil would then need to be inserted. Tension can be applied to the foil by engaging the two parts (the base member and top frame) and tension could be controlled by the stencil printer by how much displacement is set.

Figure 5A:
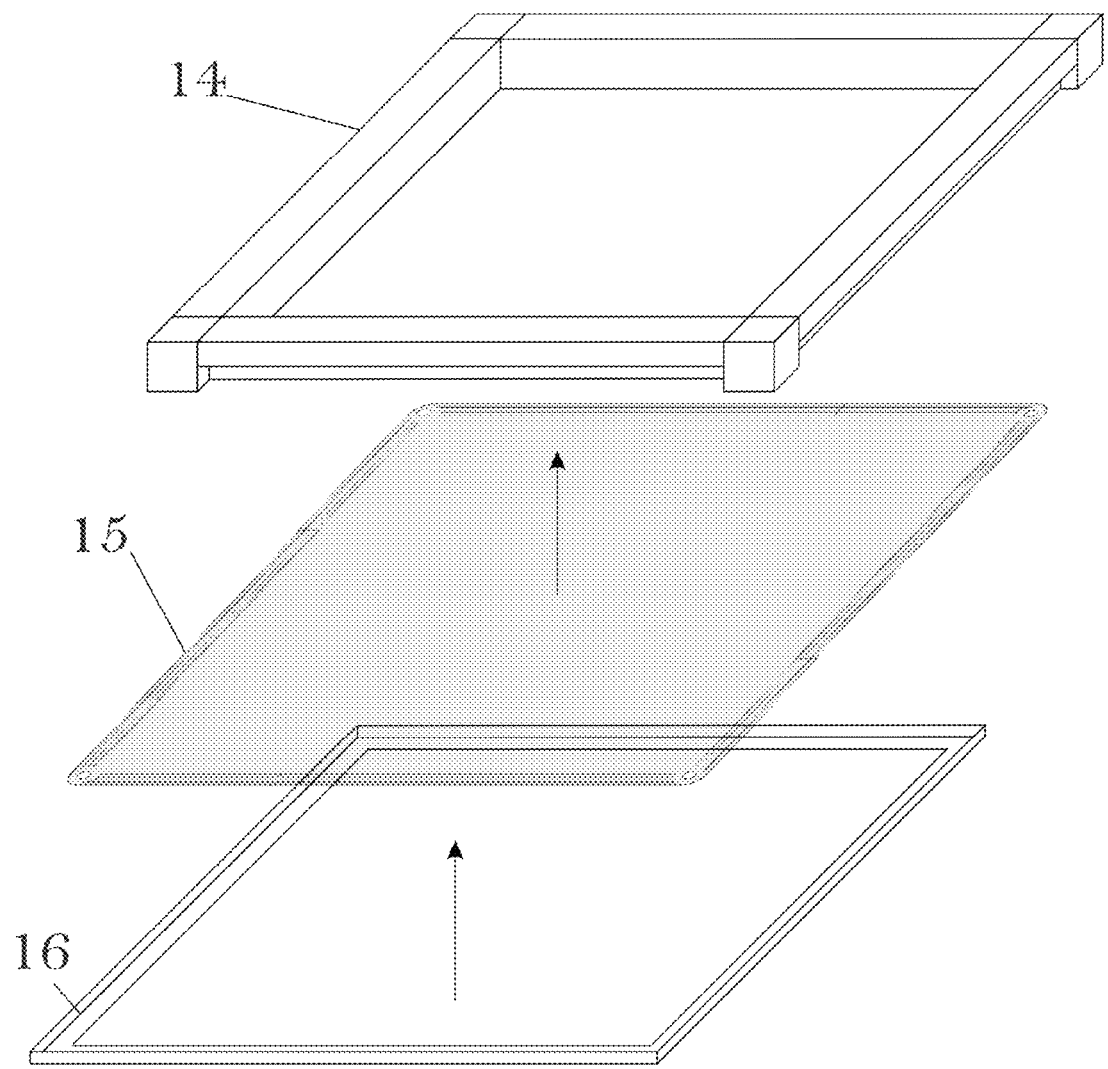
FIG. 5A is an exploded perspective view showing a frame in an unassembled state with the foil/sub-frame in an untensioned state
Figure 5B:
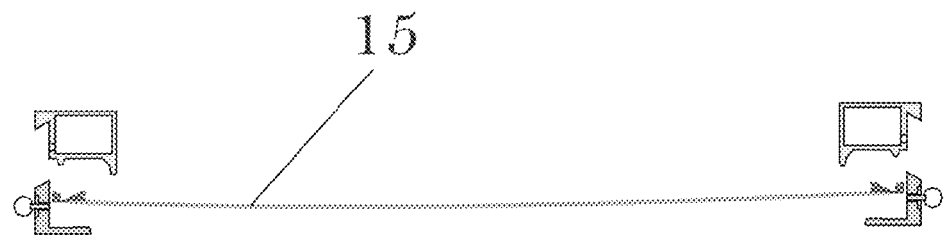
FIG. 5B is a cross-sectional view of the frame of FIG. 5A.
Figure 5C:
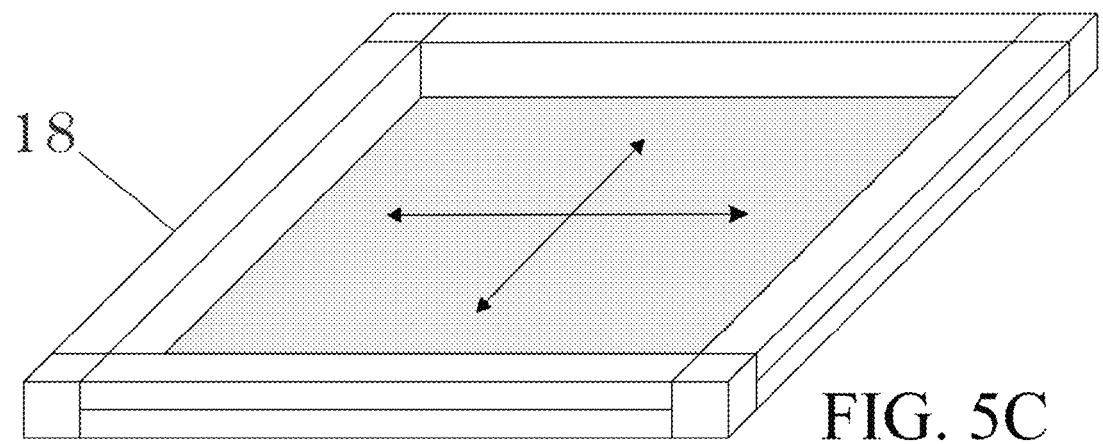
FIG. 5C is a perspective view showing a frame in an assembled state with the foil/sub-frame in a tensioned state.
Figure 5D:
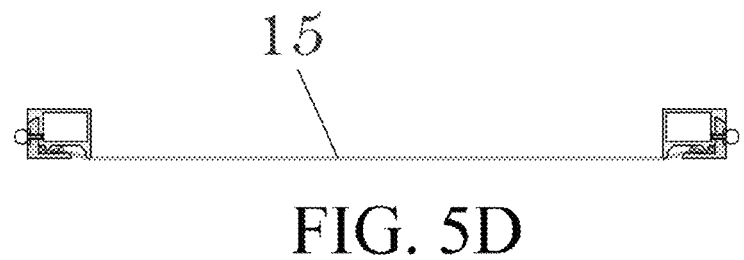
FIG. 5D is a cross-sectional view of the tensioned frame of FIG. 5C.

FIGS. 5A through 5C show the frame in an unassembled state (FIGS. 5A and 5B) with the foil/sub-frame 15 in an un-tensioned state. A base frame 16 can be part of the assembly and can retain the foil/sub-frame 15. A frame top 14 of the displacement frame can be clamped together with the base frame 16 to pretension the foil/sub-frame 15. When the displacement frame 18 is assembled (FIGS. 5C and 5D), the foil/sub-frame 15 is placed under tension.

Figure 6A:
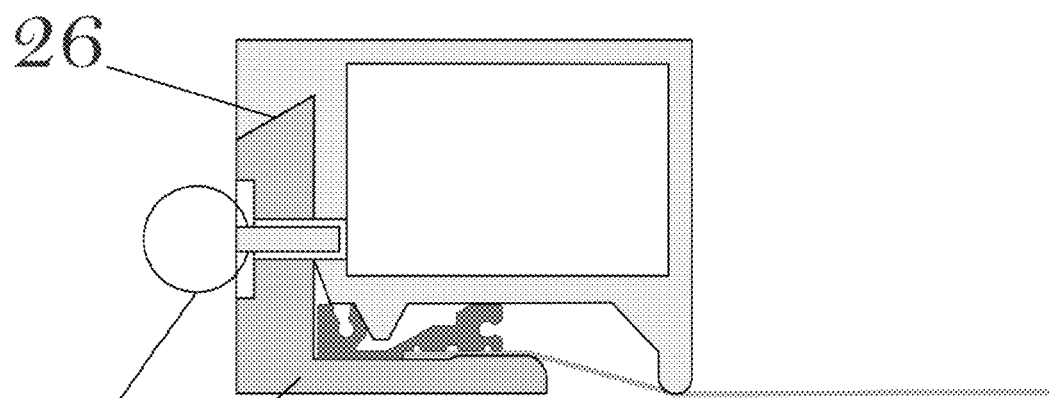
FIG. 6A is a side profile of the base frame and the displacement frame, which, when clamped together with the base frame, pretensions the foil/sub-frame.
Figure 6B:
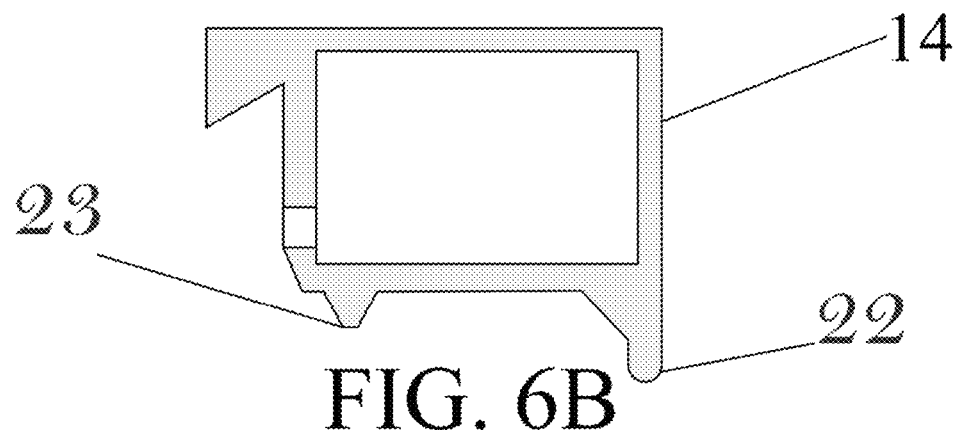
FIG. 6B is a side profile of the displacement frame of FIG. 6A.
Figure 6C:
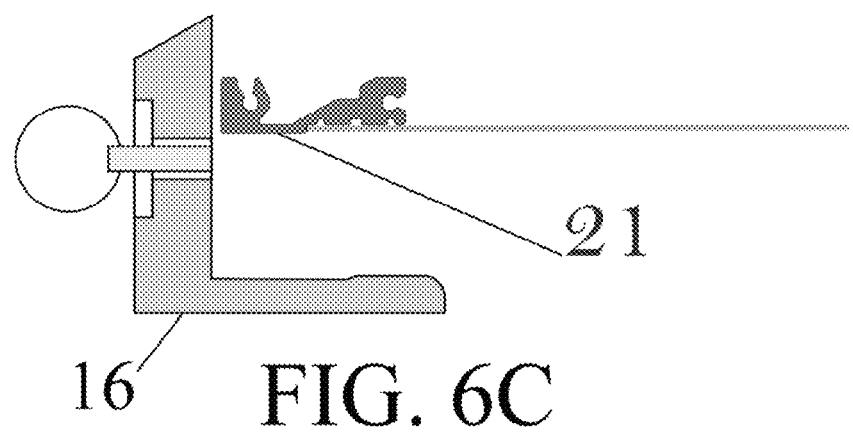
FIG. 6C is a side profile of the base frame of FIG. 6A.

FIGS. 6A through 6C show side profiles of both the base frame 16, the frame top 14 and a typical foil/sub-frame profile 21. A displacement protrusion 22 can run along the perimeter of the frame top 14. The displacement protrusion 22 pushes into the foil 1 when fully assembled to create a uniform reference point and to create tension in the foil 1. A fixed protrusion or a sprung sliding protrusion 23 can be used to pre-tension the foil/sub-frame by engaging into a feature in the foil/sub-frame profile 21. When the displacement frame 18 is fully assembled, a latching device 25 can retain and maintain the two pieces (frame top 14 and base frame 16) together. A wedged protrusion 26 can be provided to constrain the base frame 16 from any tilting when forces are applied.

Figure 7A:
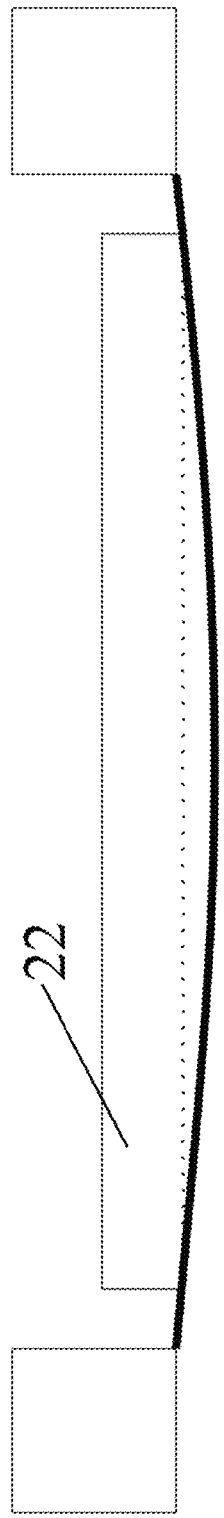
FIG. 7A shows the displacement protrusion profiled with a slight curve along its length.
Figure 7B:
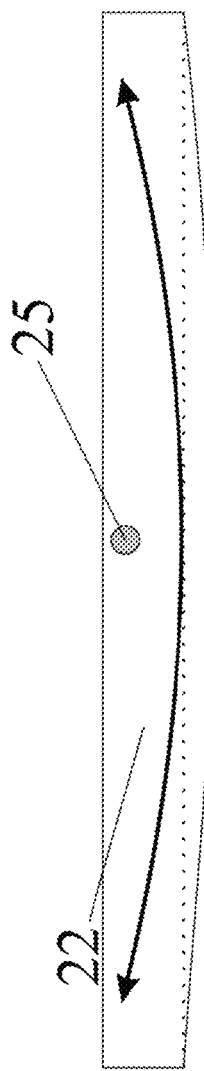
FIG. 7b shows a floating displacement member pivoted in the center so that as the member is pressed into the stencil foil, it will find its correctly balanced position.

Referring to FIGS. 7A and 7B, the displacement protrusion 22 can be profiled with a slight curve along its length (FIG. 7A). The intent is to create a uniform tension as foil resistance in the corners tends to be higher and requires greater displacement. With a rounded graduation, less displacement is achieved closer to the corners. A floating displacement member 24 (FIG. 7B) can pivot in the center 25 so that as the member is pressed into the stencil foil, it will find its correctly balanced position, ensuring there is uniform tension from corner to corner along its linear length. The floating design of FIG. 7B can eliminate any position or tolerance errors.

Figure 8:
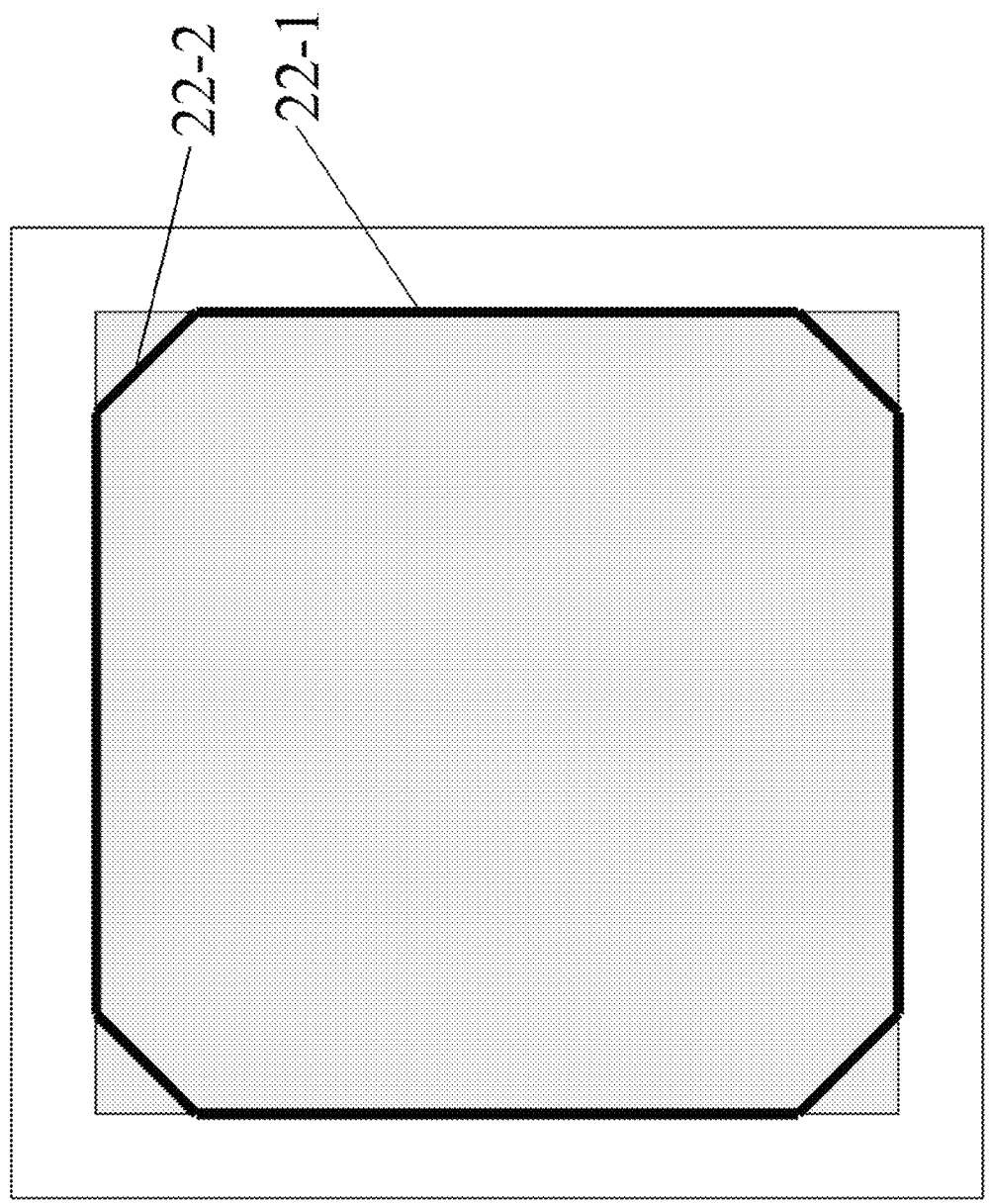
FIG. 8 shows an alternative displacement protrusion with an octagonal shape around the perimeter of the frame.

FIG. 8 shows an alternative displacement protrusion 22-1 with an octagonal shape around the perimeter of the frame. The corner diagonal pieces 22-2 create uniform tension in the corners as the resistance of the foil is greater in the corners, of which this alternative displacement protrusion 22-1 is intended to compensate. These could be curved corners instead of straight.

Figure 9A:
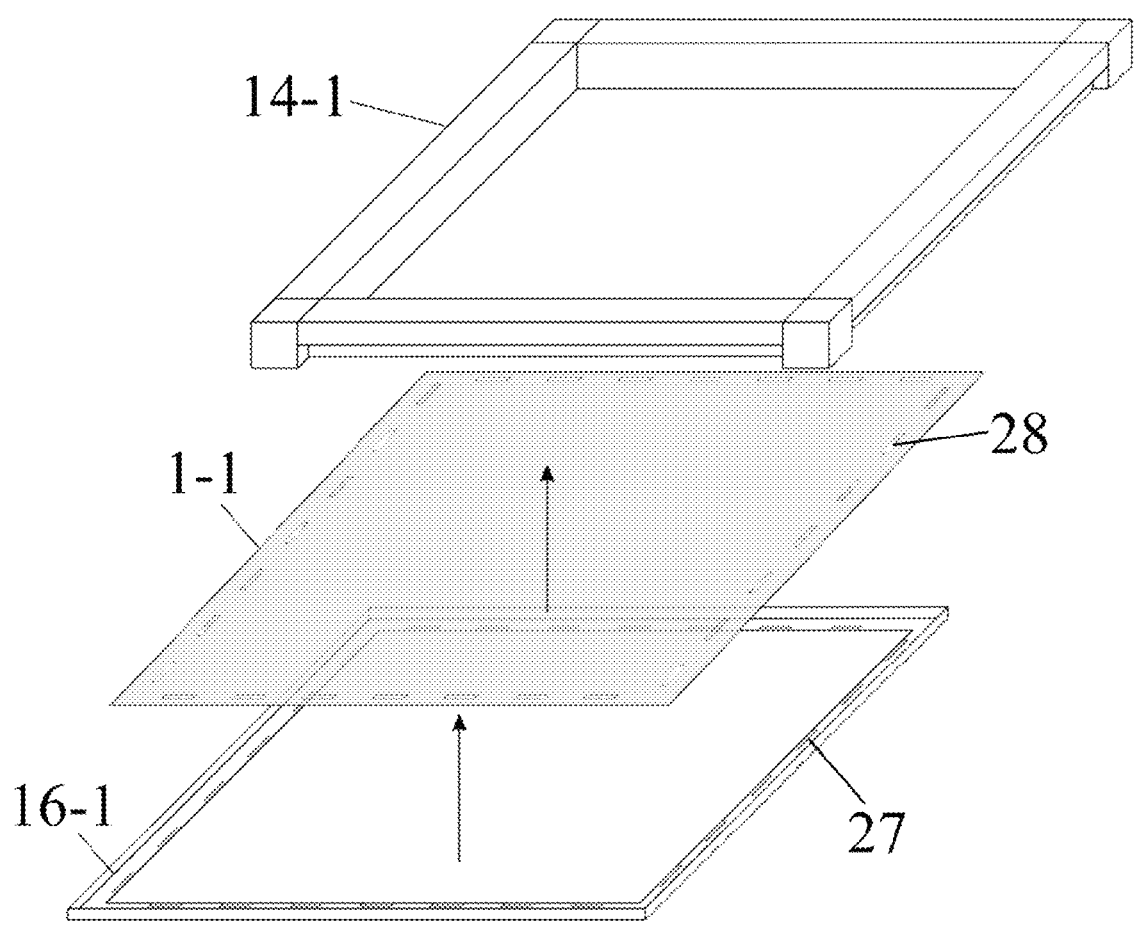
FIG. 9A is an exploded perspective view showing a base frame with matching castellation that match slots cut into the foil.

FIG. 9A shows an alternate embodiment of a base frame 16-1 that may including matching castellation 27 that match slots 28 cut into a foil 1-1. The castellation 27 could be pins, protrusions or the like. This design can prevent any lateral movement of the foil 1-1 when the frame top 14-1 presses into the foil 1-1 to create the tension.

Figure 9B:
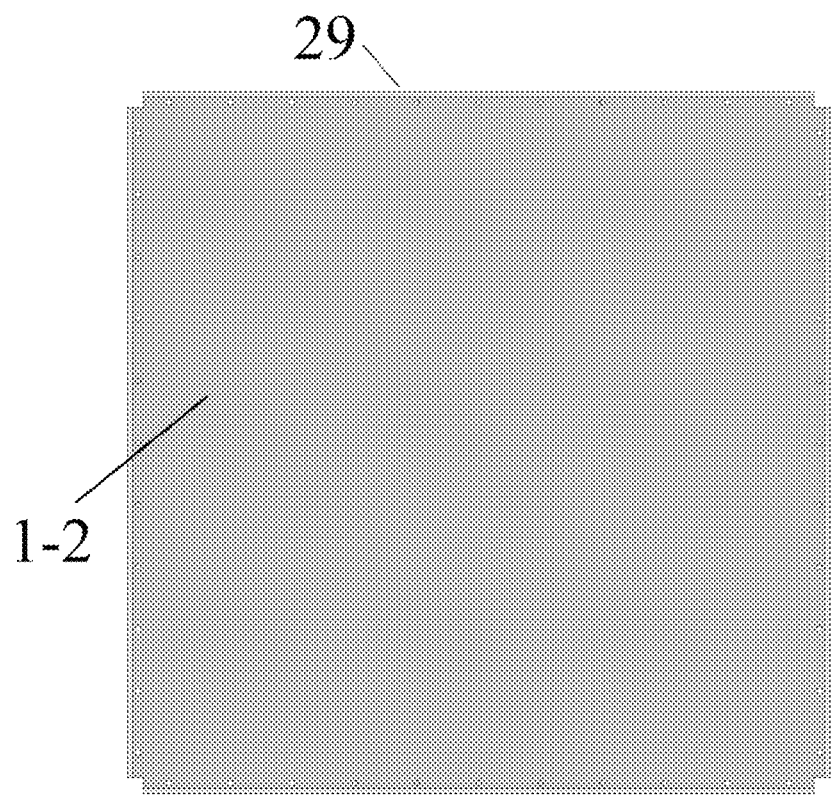
FIG. 9B shows a top view of a foil adapted for use with the frame of the present invention.
Figure 9C:
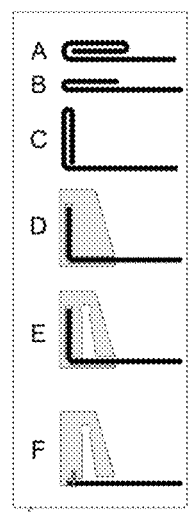
FIG. 9C shows various foil edge designs.

FIG. 9B shows a foil 1-2 having slots 28 with a protected edge 29. The protected edge 29 can take various forms, such as folded edges (examples A, B and C of FIG. 9C), slip on profiles (examples D and E of FIG. 9C), or stapled, glued or mechanically attached profiles (example F of FIG. 9C).

It should be understood, of course, that the foregoing relates to exemplary embodiments of the invention and that modifications may be made without departing from the spirit and scope of the invention as set forth in the following claims.

What is claimed is:

1. A balanced stencil foil tensioning frame comprising:
   a base member formed generally in an L-shape;
   a frame top fitting into the L-shape of the base frame member;
   a protrusion extending from a bottom portion of the frame top in a downward direction toward the base member, the protrusion structured to fit into a feature of a foil/sub-frame profile of a foil;
   a displacement protrusion extending from the bottom portion of the frame top in the downward direction, the displacement protrusion structured to press against the foil when the foil is supported by the base member and the frame top is engaged with the base member; and
   a latching device holding the frame top to the base member.

2. The balanced stencil foil tensioning frame of claim 1, wherein the base member has an angled upper end and the frame top engages with the angled upper end.

3. The balanced stencil foil tensioning frame of claim 1, wherein a degree of tension of the foil is adjustable by controlling the degree of engagement between the base member and the frame top.

4. The balanced stencil foil tensioning frame of claim 1, wherein the latching device includes a pin fitting through a hole in the base member and engaging a hole in the frame top.

5. The balanced stencil foil tensioning frame of claim 1, wherein the displacement protrusion has an arc-shaped profile, wherein increased tension is provided against the foil along the edges at central regions thereof.

6. The balanced stencil foil tensioning frame of claim 5, wherein the displacement protrusion pivots about a central axis.

7. The balanced stencil foil tensioning frame of claim 1, wherein the displacement protrusion has an octagon shape, having corner diagonal pieces.

8. The balanced stencil foil tensioning frame of claim 1, further comprising castellation along the base member matching slots in the foil, wherein the foil is positioned with its slots in the castellation before the frame top is applied.

9. The balanced stencil foil tensioning frame of claim 8, wherein the castellation are pins extending from the base member.

10. The balanced stencil foil tensioning frame of claim 1, wherein an edge of the foil is protected from contact with the user.

11. A balanced stencil foil tensioning frame comprising:
    a base member formed generally in an L-shape;
    a frame top fitting into the L-shape of the base frame member;
    a protrusion extending from a bottom portion of the frame top in a downward direction toward the base member, the protrusion structured to fit into a feature of a foil/sub-frame profile of a foil;
    a displacement protrusion extending from the bottom portion of the frame top in the downward direction, the displacement protrusion structured to press against the foil when the foil is supported by the base member and the frame top is engaged with the base member; and
    a latching device holding the frame top to the base member, wherein
    the base member has an angled upper end and the frame top engages with and mates to a shape of the angled upper end.

12. The balanced stencil foil tensioning frame of claim 11, wherein a degree of tension of the foil is adjustable by controlling the degree of engagement between the base member and the frame top.

13. The balanced stencil foil tensioning frame of claim 11, wherein the latching device includes a pin fitting through a hole in the base member and engaging a hole in the frame top.

14. The balanced stencil foil tensioning frame of claim 11, wherein the displacement protrusion has an arc-shaped profile, wherein increased tension is provided against the foil along the edges at central regions thereof.

15. The balanced stencil foil tensioning frame of claim 11, wherein the displacement protrusion has an octagon shape, having corner diagonal pieces.

16. The balanced stencil foil tensioning frame of claim 11, wherein the displacement protrusion pivots about a central axis.

17. The balanced stencil foil tensioning frame of claim 11, further comprising castellation along the base member matching slots in the foil, wherein the foil is positioned with its slots in the castellation before the frame top is applied.

18. The balanced stencil foil tensioning frame of claim 17, wherein the castellation are pins extending from the base member.

19. The balanced stencil foil tensioning frame of claim 11, wherein an edge of the foil is protected from contact with the user.

\* \* \* \* \*